United States Patent
Song

(10) Patent No.: US 9,087,836 B2
(45) Date of Patent: Jul. 21, 2015

(54) SEMICONDUCTOR DEVICE WITH REDUCED DEFECTS

(71) Applicant: Semiconductor Manufacturing International Corp., Shanghai (CN)

(72) Inventor: Hualong Song, Shanghai (CN)

(73) Assignee: SEMICONDUCTOR MANUFACTURING INTERNATIONAL CORP., Shanghai (CN)

( * ) Notice: Subject to any disclaimer, the term of this patent is extended or adjusted under 35 U.S.C. 154(b) by 0 days.

(21) Appl. No.: 14/514,956

(22) Filed: Oct. 15, 2014

(65) Prior Publication Data

US 2015/0028429 A1    Jan. 29, 2015

Related U.S. Application Data

(62) Division of application No. 13/672,696, filed on Nov. 8, 2012, now Pat. No. 8,889,516.

(30) Foreign Application Priority Data

Mar. 12, 2012 (CN) .......................... 2012 1 0064094

(51) Int. Cl.
*H01L 21/336* (2006.01)
*H01L 29/51* (2006.01)
*H01L 21/28* (2006.01)
*H01L 29/78* (2006.01)

(52) U.S. Cl.
CPC ........ *H01L 29/513* (2013.01); *H01L 21/28194* (2013.01); *H01L 29/517* (2013.01); *H01L 29/518* (2013.01); *H01L 29/78* (2013.01)

(58) Field of Classification Search
USPC ....................................................... 257/411
See application file for complete search history.

(56) References Cited

U.S. PATENT DOCUMENTS

| 6,461,939 | B1 | 10/2002 | Furihata et al. |
| 8,524,591 | B2 | 9/2013 | Beyer et al. |
| 2006/0148249 | A1 | 7/2006 | Bae et al. |
| 2006/0246698 | A1 | 11/2006 | Yao et al. |

*Primary Examiner* — Alexander Ghyka
(74) *Attorney, Agent, or Firm* — Anova Law Group, PLLC

(57) ABSTRACT

A method is disclosed for fabricating a semiconductor structure. The method includes providing a semiconductor substrate having an oxide layer on a surface of the semiconductor substrate, and removing the oxide layer to expose the surface of the semiconductor substrate. The method also includes performing a thermal annealing process on the semiconductor substrate using an inert gas as a thermal annealing protective gas after removing the oxide layer, and forming an insulating layer on the semiconductor substrate after performing the thermal annealing process. Further, the method includes forming a high-K gate dielectric layer on a surface of the insulating layer, and forming a protective layer on a surface of the high-K gate dielectric layer.

15 Claims, 4 Drawing Sheets

SEMICONDUCTOR DEVICE WITH REDUCED DEFECTS

CROSS REFERENCE TO RELATED APPLICATIONS

This application is a divisional of U.S. patent application Ser. No. 13/672,696, filed on Nov. 8, 2012, which claims priority to Chinese Patent Application No. 201210064094.X, filed on Mar. 12, 2012, all of which are incorporated herein by reference in their entirety.

FIELD OF THE INVENTION

The present invention relates to the field of semiconductor manufacturing technology and, more particularly, relates to techniques for fabricating high-performance semiconductor devices and transistors.

BACKGROUND

With rapid development on integrated circuit (IC) manufacturing technology, size of semiconductor devices in ICs, especially the size of MOS (Metal Oxide Semiconductor) devices, continues to shrink in order to meet the requirements for miniaturization and high-degree-integration of integrated circuits. As the size of the MOS transistor devices decreases continuously, the existing fabrication technology, which uses silicon oxide or silicon oxynitride as the gate dielectric layer, has been challenged. More specifically, transistors with silicon oxide or silicon oxynitride based gate dielectric layer may have certain problems, such as increased leakage current and impurity diffusion, which may affects the threshold voltage of the transistors. Thus, the performance of semiconductor devices based on such transistors may be impacted.

To solve these problems, transistors with high dielectric constant (high-K) metal gate structures have been introduced. By replacing the silicon oxide or silicon oxynitride gate dielectric materials with the high-K materials, the leakage current can be reduced while the size of the semiconductor devices decreases, and the performance of the semiconductor devices can be improved.

However, under current fabrication processes, transistors with high-K metal gate structures may still generate leakage current and may also have bias temperature instability. The disclosed methods and systems are directed to solve one or more problems set forth above and other problems.

BRIEF SUMMARY OF THE DISCLOSURE

One aspect of the present disclosure includes a method for fabricating a semiconductor structure. The method includes providing a semiconductor substrate having an oxide layer on a surface of the semiconductor substrate, and removing the oxide layer to expose the surface of the semiconductor substrate. The method also includes performing a thermal annealing process on the semiconductor substrate using an inert gas as a thermal annealing protective gas after removing the oxide layer, and forming an insulating layer on the semiconductor substrate after performing the thermal annealing process. Further, the method includes forming a high-K gate dielectric layer on a surface of the insulating layer, and forming a protective layer on a surface of the high-K gate dielectric layer.

Another aspect of the present disclosure includes a semiconductor structure. The semiconductor structure includes a semiconductor substrate, a gate structure formed on the semiconductor substrate, sidewalls covering sides of the gate structure, and source and drain regions formed in the semiconductor substrate on adjacent sides of the gate structure. The gate structure is formed by sequentially forming an insulating layer on the semiconductor substrate, forming a high-K gate dielectric layer on a surface of the insulating layer, forming a protective layer on a surface of the high-K gate dielectric layer, and forming a gate electrode layer on the protective layer. Further, before forming the insulating layer, an oxide layer is removed from a surface of the semiconductor substrate, and a thermal annealing process is performed on the semiconductor substrate using an inert gas as a thermal annealing protective gas.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
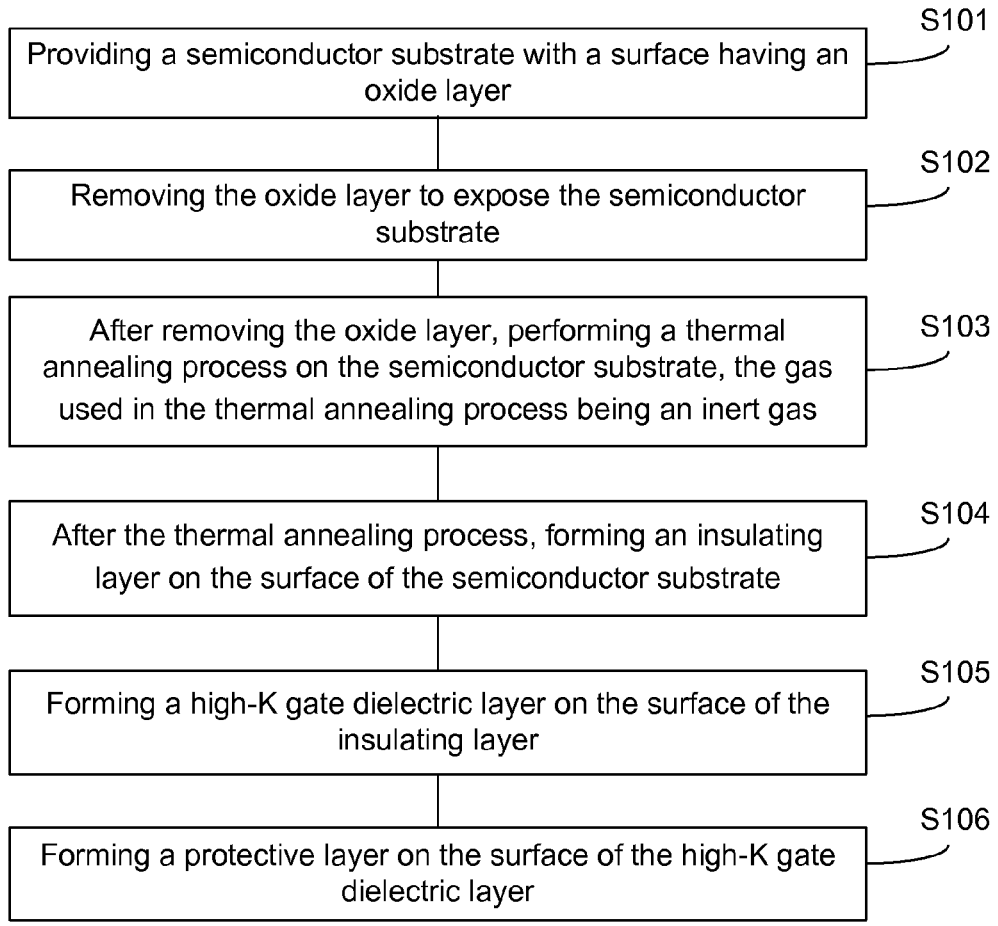
FIG. 1 illustrates an exemplary fabrication process of a semiconductor device consistent with the disclosed embodiments.

FIG. 1 illustrates an exemplary fabrication process S10 of a semiconductor device, and FIGS. 2-6 illustrate exemplary semiconductor structures forming a semiconductor device 10 corresponding to various stages of the fabrication process S10.

Figure 2:
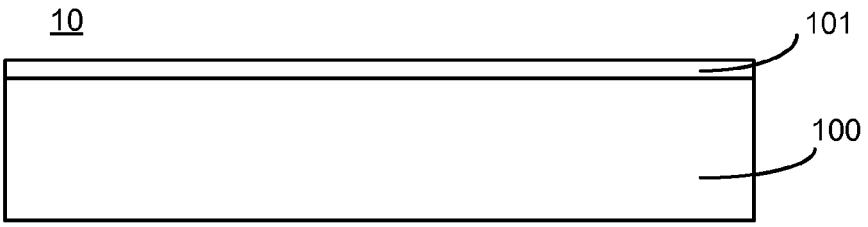
FIGS. 2-6 illustrate exemplary semiconductor structures corresponding to certain stages of the fabrication process consistent with the disclosed embodiments.

As shown in FIG. 1, at the beginning of the fabrication process, a semiconductor substrate is provided (S101). FIG. 2 shows a corresponding semiconductor device 10.

As shown in FIG. 2, a semiconductor substrate 100 is provided as the base for the semiconductor device 10. The semiconductor substrate 100 may be made of any appropriate type of semiconductor material, such as silicon, silicon on insulator, silicon germanium (SiGe), carborundum, indium antimonide, lead telluride, indium arsenide, indium phosphide, gallium arsenide or gallium antimonide, alloy semiconductor, or a combination thereof. The semiconductor substrate 100 also provides a base for subsequent processes and structures.

An oxide layer 101 may be formed on the surface of the semiconductor substrate 100. The oxide layer 101 may include silicon oxide, and may be formed by various ways. For example, the oxide layer 101 may be formed on the semiconductor substrate 100 by a preceding process, or the oxide layer 101 may be formed naturally when the semiconductor substrate 100 is exposed in the air. However, the oxide layer 101 may need to be removed before forming any subsequent layer, such as insulating layer or dielectric layer, on the semiconductor substrate 100.

Figure 3:

Returning to FIG. 1, after the semiconductor substrate 100 is provided (S101), the oxide layer 101 on the semiconductor substrate 100 is removed (S102). FIG. 3 shows a corresponding semiconductor device 10.

As shown in FIG. 3, the oxide layer 101 is removed from the surface of the semiconductor substrate 100 and the semiconductor substrate 100 is exposed. Further, the oxide layer 101 may be removed by any appropriate method. For example, the oxide layer 101 may be removed by a wet etching process or by a chemical mechanical polishing process. Other methods may also be used. When the wet etching process is used, the etching liquid may be a hydrofluoric acid solution.

After the oxide layer 101 is removed using an etching or polishing process, the exposed surface of the semiconductor substrate 100 may be rough, and defects with high free-energy may be formed on the surface of the semiconductor substrate 100. The rough surface of the semiconductor substrate 100 may cause deformation or defects of subsequent layers formed in the surface of the semiconductor substrate 100, such as the insulating layer and high-K gate dielectric layer.

Further, the high free-energy defects may become carrier trapping centers, which can cause the later formed transistor to generate leakage current. That is, when the transistor is in operation, carriers in the transistor can be easily trapped in the carrier trapping centers, generating leakage current and causing bias temperature instability. Thus, the performance of the transistor may decrease.

Returning to FIG. 1, after the oxide layer 101 on the semiconductor substrate 100 is removed (S102), a thermal annealing process is performed on the semiconductor substrate 100 (S103).

The thermal annealing process may be used to treat the semiconductor substrate 100 and may be performed in various ways. For example, a furnace annealing process or a rapid thermal anneal (RTA) may be performed. The annealing temperature may be set in a range of approximately 650° C.~1150° C., and the annealing time may be set to a range of approximately 5 seconds to 5 hours. Other temperature and time period may also be used. Further, the protective gas may be an inert gas, such as argon, helium, or neon. In one embodiment, argon gas is used.

More particularly, in certain embodiments, after the removal of oxide layer 101, the semiconductor substrate 100 is placed in an annealing furnace. The annealing furnace is filled with an inert gas (e.g., one or more of argon, helium, and neon) as the protective gas. The annealing temperature of the annealing furnace is controlled at above 650° C., preferably at about 650° C.~1150° C. The semiconductor substrate 100 is annealed for at least 5 seconds, preferably for about 5 seconds to 5 hours.

Such thermal annealing process may enable silicon atoms in the semiconductor substrate of 100 to migrate and to fill the defects on the surface of the semiconductor substrate 100 caused by the oxide layer removal process. In other words, surface silicon atoms may migrate and establish positions that the surface structure is with the lowest free energy, which fill the defects on the surface of the semiconductor substrate 100.

Thus, the surface of the semiconductor substrate 100 is significantly smoother than the surface of the semiconductor substrate 100 before the thermal annealing. This also lowers the free energy and eliminates or significantly reduces the number of the carrier trapping centers on the surface of the semiconductor substrate 100. Thus, the subsequently formed insulating layer and high-K dielectric layer have significantly less defects and the leakage current of the later formed transistor is also suppressed.

Further, the inert gas (e.g., argon, helium, or neon) is used as the protective gas in the thermal annealing process, such that the semiconductor substrate 100 does not react with the protective gas. It is also not easy for the inert gas to react with the subsequently formed insulating layer and high-K gate dielectric layer. Further, because the inert gas is a monatomic gas, when chosen as the thermal annealing protective gas, the inert gas does not decompose and absorb heat when heated. Thus, the inert gas does not influence the thermal annealing process. Also, compared to the hydrogen gas often used by existing technologies, inert gas is safer due to its inertness to fire or explosion.

Figure 4:
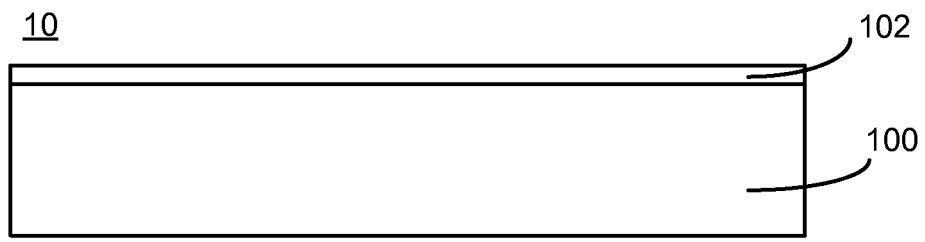

Returning to FIG. 1, after the thermal annealing process is performed on the semiconductor substrate 100 (S103), an insulating layer is formed on the semiconductor substrate 100 (S104). FIG. 4 shows a corresponding semiconductor device 10.

As shown in FIG. 4, an insulating layer 102 is formed on the surface of the semiconductor substrate 100. The insulating layer 102 may be made of any appropriate type of insulating material, such as silicon oxide, silicon nitride, or silicon oxynitride. Other materials may also be used.

The insulating layer 102 may be formed using any appropriate type of process. For example, the insulating layer 102 may be formed by a chemical vapor deposition (CVD) process or the insulating layer 102 may be formed by a thermal oxidation process. When the thermal oxidation process is used to form the insulating layer 102, the semiconductor substrate 100 is first placed in a high-temperature environment (e.g., a reaction chamber). A gas, such as oxygen, nitrogen, or nitrogen-oxygen gas mixture, may be filled in the reaction chamber to form an insulating layer of silicon oxide, silicon nitride, or silicon oxynitride on the surface of the semiconductor substrate 100.

Because, after the thermal annealing process, the surface of the semiconductor substrate 100 has significantly less defects than that before the thermal annealing process, the insulating layer 102 can be formed with no or substantially low number of defects, and the later formed transistor may have desired characteristics on leakage current and bias temperature instability, etc.

That is, between the oxide removal process and the subsequent fabrication process stage, such as forming the insulating layer 102, a conditioning process is inserted to significantly improve the characteristics of the semiconductor substrate 100, such as the roughness of the surface of the semiconductor substrate 100 and other semiconductor parameters of the semiconductor substrate 100, such that the subsequent fabrication processes can be performed to create semiconductor structures with desired characteristics (e.g., less or no surface defects, less or no leakage current, and/or less or no bias temperature instability). More particularly, the above described thermal annealing process makes the surface of the semiconductor substrate 100 significantly smoother than the surface right after the removal of the oxide layer 101, with substantially low free energy, and substantially small number of carrier trapping centers.

In addition, the formed insulating layer 102 may be used as a buffer layer between the subsequently formed high-K gate dielectric layer and the semiconductor substrate 100. If the high-K gate dielectric layer were directly formed on the surface of the semiconductor substrate 100, the surface of the semiconductor substrate 100 may have a large number of charge trapping centers, which impacts the reliability of the later formed transistor. Further, the high-K gate dielectric material may have a strong polarity, a direct contact with the semiconductor substrate 100 may result in increased Coulomb scattering effect in the channel region of the transistor, which may reduce carrier mobility and weaken the performance of the transistor. However, these problems may be solved by using the insulating layer 102 as the buffer layer between the high-K gate dielectric layer and the semiconductor substrate 100. Thus, the insulating layer 102 may also be considered as a bonding layer between the high-K gate dielectric layer and the semiconductor substrate 100.

Figure 5:
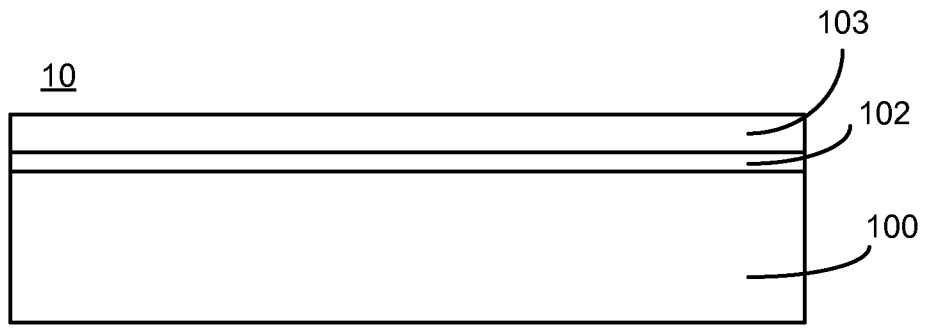

Returning to FIG. 1, after the insulating layer 102 is formed on the semiconductor substrate 100 (S104), a high-K gate dielectric layer is formed on the surface of the insulating layer 102 over the surface of the semiconductor substrate 100 (S105). FIG. 5 shows a corresponding semiconductor device 10.

As shown in FIG. 5, a high-K gate dielectric layer 103 is formed on the surface of the insulating layer 102. The high-K gate dielectric layer 103 may be made of any appropriate material with high K value, such as hafnium oxide, zirconium oxide, hafnium oxide silicon, lanthanum oxide, zirconium oxide silicon, titanium oxide, tantalum oxide, barium strontium titanium oxide, barium titanium oxide, strontium titanium oxide, aluminum oxide, or any combination thereof. Other materials may also be used.

Further, the high-K gate dielectric layer 103 may be formed by a chemical vapor deposition (CVD) process or by a single atomic layer deposition (ALD) process. Such formed high-K gate dielectric layer 103 may have desired thermal stability and mechanical strength, may reduce the carrier diffusion, and may further reduce the leakage current of the later formed transistor.

Figure 6:
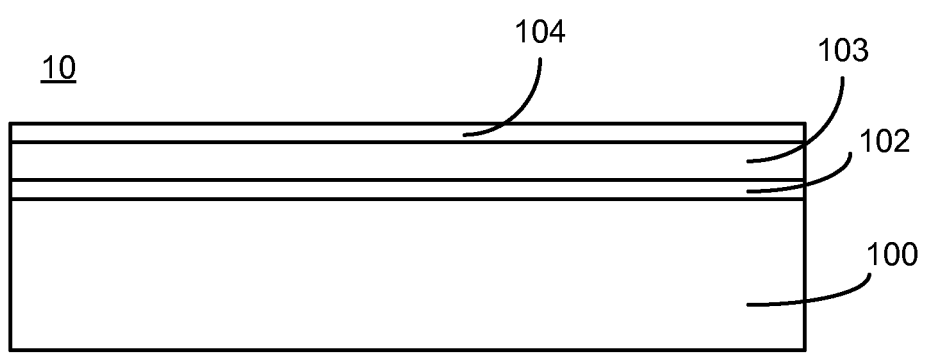

Returning to FIG. 1, after the high-K gate dielectric layer 103 is formed on the insulating layer 102 (S105), a protective layer is formed on the high-K gate dielectric layer 103 over the insulating layer 102 (S106). FIG. 6 shows a corresponding semiconductor device 10.

As shown in FIG. 6, a protective layer 104 is formed on the surface of the high-K gate dielectric layer 103. The protective layer 104 may be made of any appropriate type of material, such as titanium nitride, nitride thallium, nitride tungsten, or alumina oxide. Further, the protective layer 104 is made of a material that is different from the material used to form the high-K gate dielectric layer 103. The protective layer 104 may also be formed by a CVD process or by a single layer ALD process.

The formed protective layer 104 may be used to protect the surface of the high-K gate dielectric layer 103, so that the high-K gate dielectric layer 103 is not damaged in subsequent processes, such as forming a gate electrode layer. At the same time, as a part of the later formed transistor, such protective layer 104 can also prevent carrier diffusion into the high-K dielectric layer 103, and can further suppress the generation of leakage current.

Figure 7:
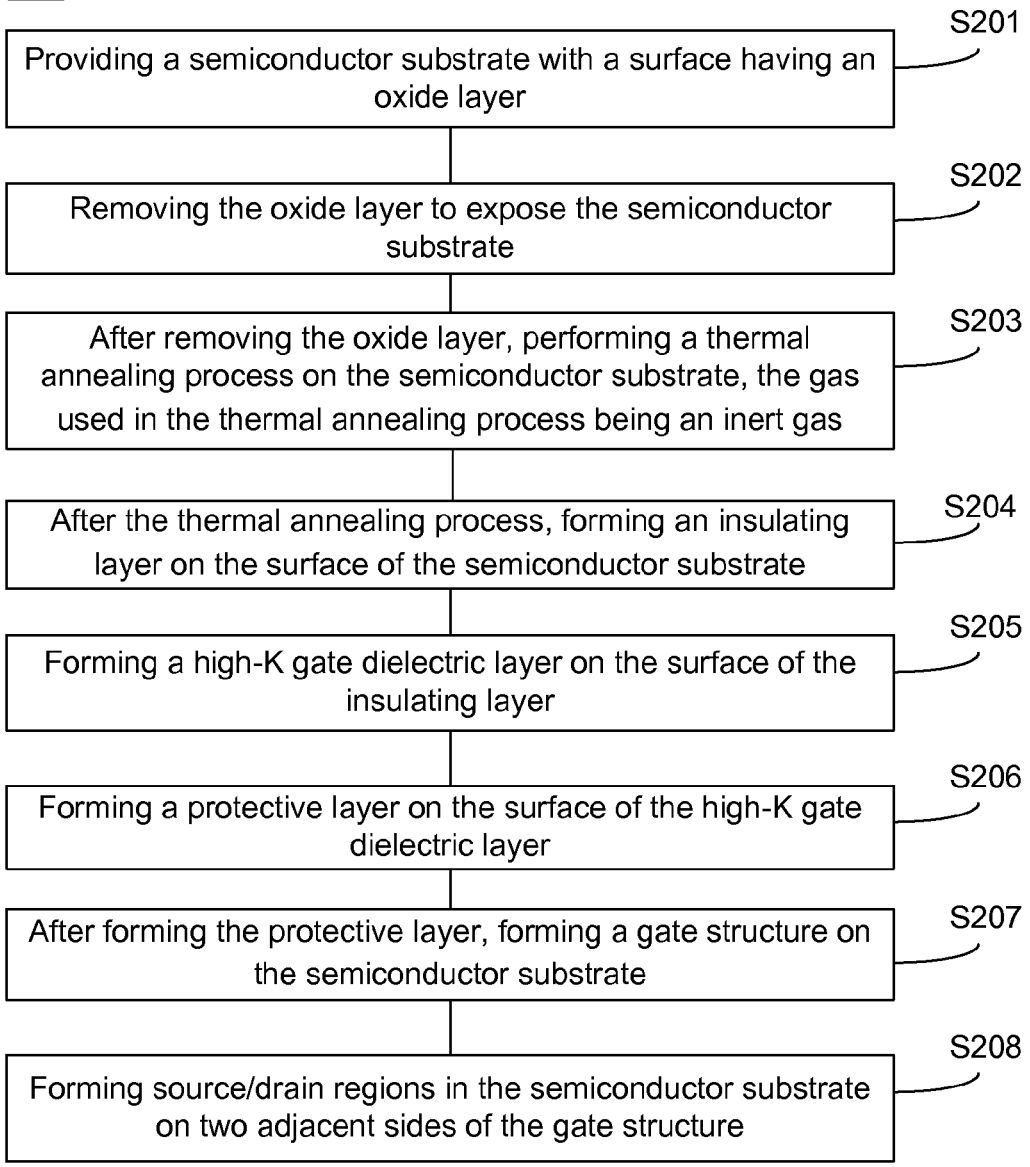
FIG. 7 illustrates another exemplary fabrication process of a semiconductor device consistent with the disclosed embodiments.
Figure 8:
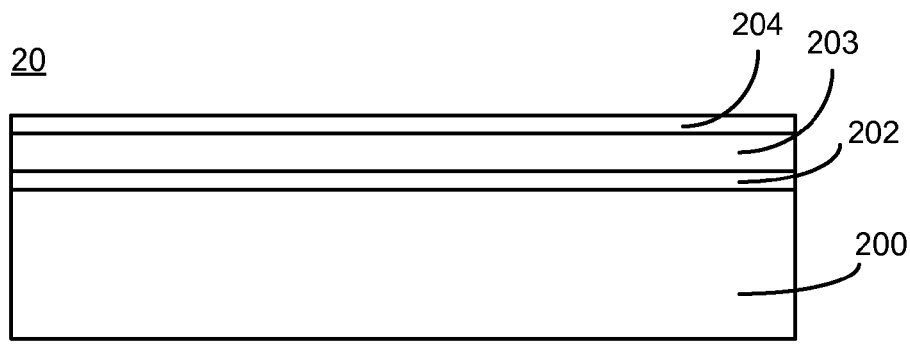
FIGS. 8-10 illustrate exemplary semiconductor structures corresponding to certain stages of the fabrication process consistent with the disclosed embodiments.
Figure 9:
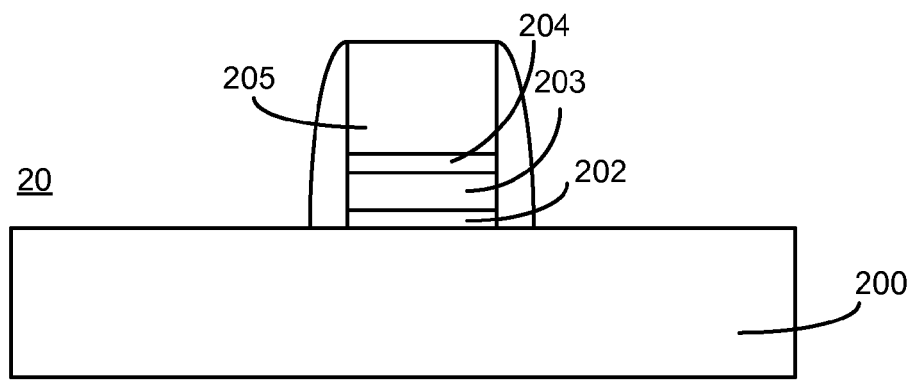
Figure 10:
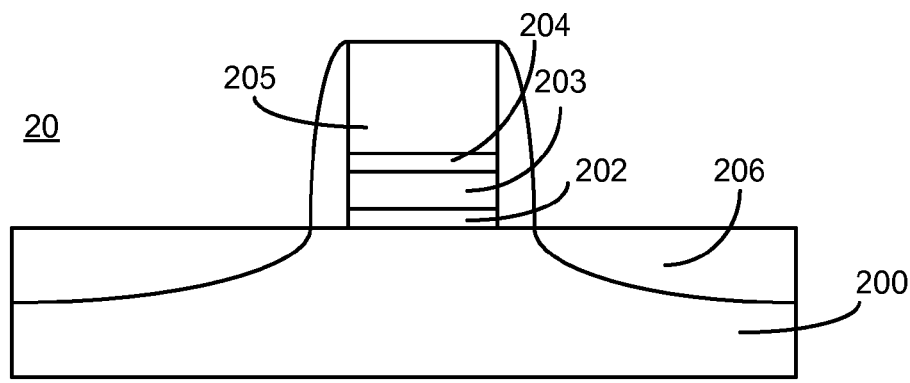

FIG. 7 illustrates another exemplary fabrication process S20 of a semiconductor device, and FIGS. 8-10 illustrate exemplary semiconductor structures forming the semiconductor device 20 corresponding to various stages of the fabrication process S20.

As shown in FIG. 7, the fabrication process S20 includes: providing a semiconductor substrate with a surface having an oxide layer (S201); removing the oxide layer to expose the semiconductor substrate (S202); after removing the oxide layer, performing a thermal annealing process on the semiconductor substrate, the gas used in the thermal annealing process being an inert gas (S203); after the thermal annealing process, forming an insulating layer on the surface of the semiconductor substrate (S204); forming a high-K gate dielectric layer on the surface of the insulating layer (S205); and forming a protective layer on the surface of the high-K gate dielectric layer (S206).

Because S201-S206 are similar to S101-S106 shown in FIG. 1, the detailed descriptions of S201-S206 are omitted herein. FIG. 8 shows a corresponding semiconductor device 20 after forming the protective layer.

As shown in FIG. 8, to form semiconductor device 20, semiconductor substrate 200 is first provided, and the surface of the semiconductor substrate 200 has an oxide layer (not shown). The oxide layer is then removed to expose the semiconductor substrate 200. Further, after removing the oxide layer on the semiconductor substrate 200, a thermal annealing is performed on the semiconductor substrate 200 using an inert gas as the thermal annealing gas.

After the thermal annealing process, insulating layer 202 is formed on the surface of the semiconductor substrate 200, and high-K gate dielectric layer 203 is formed on the surface of the insulating layer 202. Further, protective layer 204 is formed on the surface of the high-K gate dielectric layer 203.

Further, the fabrication process S20 may also include other process stages for forming a transistor or other type of semiconductor device. For example, after forming the protective layer 204, a gate structure is formed on the semiconductor substrate 200 (S207). FIG. 9 shows a corresponding semiconductor device 20.

The gate structure may be formed by a number of process steps. For example, a gate electrode layer 205 may be formed on the protective layer 204. The gate electrode layer 205 may be made of metal or other suitable material. After forming the gate electrode layer 205, an etching process is performed on the semiconductor substrate 200 using a gate mask. Except the gate region covered by the gate mask, the etching process may remove all remaining gate electrode layer 205, protective layer 204, high-K gate dielectric layer 203, and insulating layer 202 until the semiconductor substrate 200 is exposed.

Further, a deposition process is performed on the gate structure such that a side wall layer is formed on the etched gate electrode layer 205, protective layer 204, the high-K gate dielectric layer 203, insulating layer 202, and semiconductor substrate 200. A back etching process may be used to form sidewalls on both sides of the metal gate layer 205, protective layer 204, high-K gate dielectric layer 203, and the insulating layer 202 (i.e., the gate structure), as well as on the surface of the semiconductor substrate 200 (not labeled).

Returning to FIG. 7, after the gate structure is formed on the semiconductor substrate 200 (S207), a source region and a drain region are formed on two sides of the gate structure, respectively, and adjacent to the gate structure (S208). FIG. 10 shows a corresponding semiconductor device 20.

As shown in FIG. 10, source/drain regions 206 are formed in the semiconductor substrate 200 on two adjacent sides of the gate structure. The source/drain regions 206 may be formed by first performing a lightly doped ion implantation on the semiconductor substrate 200 using the etched gate electrode layer 205 as the mask, after etching the gate electrode layer 205, the protective layer 204, the high-K gate dielectric layer 203, and the insulating layer 202 and before forming the sidewalls. Further, after forming the sidewalls, a heavily doped ion implantation is performed on the semiconductor substrate 200 using the gate structure as the mask. Other fabrication process stages may also be included. A high performance semiconductor device 20 is thus formed.

By using the disclosed structures and methods, a thermal annealing process is introduced prior to forming the insulating layer on the semiconductor substrate after removal of the oxide layer. The semiconductor substrate is conditioned by the thermal annealing process to have a smooth surface such that the number of defects on the surface of the semiconductor substrate, in the insulating layer, and in the high-K dielectric layer can be significantly reduced. Thus, the leakage current of the transistor can be suppressed. Further, by using the disclosed methods, the thermal annealing process can use an inert gas as the protective gas. The inert gas not only does not react with the insulating layer and the high-K dielectric layer, but also does not impact on the thermal annealing process because the inert gas does not decompose and absorb heat when heated (i.e., endothermic). In addition, the inert gas increases safety due to its inertness to fire or explosion.

Other applications, advantages, alternations, modifications, or equivalents to the disclosed embodiments are obvious to those skilled in the art.

What is claimed is:

1. A semiconductor structure, comprising:
a conditioned semiconductor substrate, conditioned from a semiconductor substrate having a rough surface, obtained from a chemical mechanical polishing process in removing an oxide layer from the semiconductor substrate, the conditioned semiconductor substrate having a significantly smooth surface from a thermal annealing process to the rough surface using an inert gas consisting of argon, helium, and neon as a thermal annealing protective gas;
a gate structure formed on the conditioned semiconductor substrate, wherein the gate structure includes:
an insulating layer grown from the conditioned semiconductor substrate having the significantly smooth surface, wherein the insulating layer has reduced deformation or defects compared with an insulating layer formed on the semiconductor substrate having the rough surface,
a high-K gate dielectric layer disposed on the insulating layer,
a protective layer disposed on the high-K gate dielectric layer, wherein the protective layer consists of nitride thallium, nitride tungsten, and aluminum oxide, and is different from the high-K gate dielectric layer, and
a gate electrode layer disposed on the protective layer;
sidewalls covering sides of the gate structure; and
source and drain regions formed in the conditioned semiconductor substrate on both adjacent sides of the gate structure.

2. The semiconductor structure according to claim 1, wherein:
the gate structure contains etched layers of the insulating layer, the high-K gate dielectric layer, the protective layer, and the gate electrode layer.

3. The semiconductor structure according to claim 1, wherein:
the conditioned semiconductor substrate is conditioned to substantially reduce an amount of defects on the surface of the semiconductor substrate caused by removal of the oxide layer such that the insulating layer and the high-K gate dielectric layer are not impacted by the defects on the surface of the semiconductor substrate.

4. The semiconductor structure according to claim 1, wherein: the thermal annealing process is performed at a temperature of approximately 650° C.-1150° C. and within a time period of approximately 5 seconds to 5 hours.

5. The semiconductor structure according to claim 1, wherein:
the insulating layer is made of one of silicon oxide, silicon nitride, and silicon oxynitride and serves as a bonding layer between the high-K gate dielectric layer and the semiconductor substrate.

6. The semiconductor structure according to claim 1, wherein:
the high-K gate dielectric layer is made of one or more of hafnium oxide, zirconium oxide, hafnium oxide silicon, lanthanum oxide, zirconium oxide silicon, titanium oxide, tantalum oxide, barium strontium titanium oxide, barium titanium oxide, strontium titanium oxide, and aluminum oxide.

7. The semiconductor structure according to claim 6, wherein:
the high-K gate dielectric layer is formed by using a chemical vapor deposition (CVD) process or a single atomic layer deposition (ALD) process.

8. The semiconductor structure according to claim 1, wherein:
the high-K gate dielectric layer has reduced deformation or defects compared with a high-K gate dielectric layer disposed over the semiconductor substrate having the rough surface.

9. A transistor device, comprising:
a conditioned semiconductor substrate, conditioned to enable silicon atoms in a semiconductor substrate to migrate and to fill defects on a surface of the semiconductor substrate to provide a significantly smooth surface by a thermal annealing process using an inert monatomic gas consisting of argon, helium, and neon as a thermal annealing protective gas; and
a gate structure disposed on the conditioned semiconductor substrate, wherein the gate structure includes:
an insulating layer grown from the conditioned semiconductor substrate having the significantly smooth surface, wherein the insulating layer has reduced deformation or defects compared with an insulating layer formed on the semiconductor substrate,
a high-K gate dielectric layer disposed on the insulating layer, wherein the high-K gate dielectric layer has reduced deformation or defects compared with a high-K gate dielectric layer disposed over the semiconductor substrate,
a protective layer disposed on the high-K gate dielectric layer, wherein the protective layer consists of nitride thallium, nitride tungsten, and aluminum oxide, and is different from the high-K gate dielectric layer, and
a gate electrode layer disposed on the protective layer.

10. The device according to claim 9, wherein:
the gate structure contains etched layers of the insulating layer, the high-K gate dielectric layer, the protective layer, and the gate electrode layer.

11. The device according to claim 9, wherein:
the conditioned semiconductor substrate is conditioned to substantially reduce an amount of defects on the surface of the semiconductor substrate caused by removal of the oxide layer such that the insulating layer and the high-K gate dielectric layer are not impacted by the defects on the surface of the semiconductor substrate.

12. The device according to claim 9, further including:
sidewalls covering both sides of the gate structure; and
source and drain regions formed in the conditioned semiconductor substrate on both sides of the gate structure.

13. The device according to claim 9, wherein:
the insulating layer is made of one or more of silicon oxide, silicon nitride, and silicon oxynitride, and serves as a bonding layer between the high-K gate dielectric layer and the semiconductor substrate.

14. The device according to claim 9, wherein:
the high-K gate dielectric layer is made of one or more of hafnium oxide, zirconium oxide, hafnium oxide silicon, lanthanum oxide, zirconium oxide silicon, titanium oxide, tantalum oxide, barium strontium titanium oxide, barium titanium oxide, strontium titanium oxide, and aluminum oxide.

15. The device according to claim 14, wherein:
the high-K gate dielectric layer is formed by using a chemical vapor deposition (CVD) process or a single atomic layer deposition (ALD) process.

* * * * *